(12) United States Patent
Lin

(10) Patent No.: US 7,067,387 B2
(45) Date of Patent: Jun. 27, 2006

(54) METHOD OF MANUFACTURING DIELECTRIC ISOLATED SILICON STRUCTURE

(75) Inventor: Shi-Chi Lin, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 36 days.

(21) Appl. No.: 10/650,601

(22) Filed: Aug. 28, 2003

(65) Prior Publication Data

US 2005/0045984 A1    Mar. 3, 2005

(51) Int. Cl.
*H01L 21/76* (2006.01)

(52) U.S. Cl. .................. 438/409; 438/429; 438/431; 438/433; 438/447; 438/450

(58) Field of Classification Search ............... 438/408, 438/409, 429, 431, 433, 447, 450, 960; 257/E21.547, 257/E21.888, E21.545, E21.551, E21.565
See application file for complete search history.

(56) References Cited

U.S. PATENT DOCUMENTS

| | | | |
|---|---|---|---|
| 4,758,531 A * | 7/1988 | Beyer et al. ................. | 438/429 |
| 5,091,330 A | 2/1992 | Cambou et al. .............. | 437/62 |
| 5,110,755 A * | 5/1992 | Chen et al. .................. | 438/409 |
| 5,130,268 A * | 7/1992 | Liou et al. ................... | 438/425 |
| 5,217,920 A * | 6/1993 | Mattox et al. ............... | 438/431 |
| 5,466,631 A | 11/1995 | Ichikawa et al. ............ | 437/62 |
| 5,773,352 A | 6/1998 | Hamajima .................. | 438/406 |
| 5,950,094 A | 9/1999 | Lin et al. .................... | 438/409 |
| 6,093,611 A * | 7/2000 | Gardner et al. ............. | 438/295 |
| 6,436,791 B1 * | 8/2002 | Lin et al. ..................... | 438/424 |

FOREIGN PATENT DOCUMENTS

| JP | 57202756 A | * | 12/1982 |
|---|---|---|---|
| JP | 04217342 A | * | 8/1992 |

OTHER PUBLICATIONS

Wolf et al., Silicon Processing for the VLSI Era, vol. 1-Process Technology, 1986, Lattice Press, vol. 1, pp. 155-158.*

* cited by examiner

*Primary Examiner*—Jerome Jackson
*Assistant Examiner*—José R. Diaz

(57) ABSTRACT

A method for fabricating dielectric isolated silicon islands or regions is described in this invention. A hard composite mask of pad oxide and silicon nitride is first patterned on a silicon substrate and trenches of required dimensions are etched into silicon. After forming an oxide liner on trench surfaces, boron ions are implanted in areas around the trenches such that heavily doped $p^+$ regions are formed. The oxide liner is anisotropically etched with a reactive ion etching process such that only the silicon surface at trench bottom is exposed, leaving the oxide liner on trench walls. Epitaxial silicon is then deposited selectively on exposed single crystal silicon surface so as to fill the trenches. After removing the hard mask, trenches are masked with photoresist pattern and the wafer is anodically etched in an aqueous bath of HF to form a buried porous silicon layer under and around the trenches. After removing the mask, the porous silicon is then oxidized. Discrete silicon regions, electrically isolated by silicon dioxide, are then formed after removing the top oxide film on the epitaxial silicon surface.

18 Claims, 3 Drawing Sheets

METHOD OF MANUFACTURING DIELECTRIC ISOLATED SILICON STRUCTURE

BACKGROUND OF THE INVENTION (1) Field of the Invention

This invention relates generally to the method of forming electrically isolated regions on a semiconductor substrate and more particularly to the fabrication of dielectric isolation silicon structures (DIS).

(2) Description of the Prior Art

When several different electronic devices are to be formed on a single substrate, it is necessary to electrically isolate them from one another to reduce undesired interactions such as cross-talk, leakage, and electrical noise. What is often done is to form distinct regions on the silicon wafer with each region electrically isolated with a dielectric such as silicon dioxide. There are several methods described in the prior art to form these isolated regions. One method is the SIMOX (Separation by Implanted Oxygen) process wherein the dielectric region is formed by implanting oxygen ions to the required depth within the silicon substrate. The damage caused by ions to the silicon above the buried oxide is annealed out at reasonably high temperatures. Although a continuous silicon region is formed isolated from the rest of the wafer, this method requires additional steps to form isolation regions between devices fabricated later in this isolated region.

Another method is to bond two wafers, wherein one wafer has trenches formed which are then filled with a dielectric such as silicon dioxide and then planarized by chemical mechanical planarization method. The second wafer has a dielectric film formed on one surface. The two wafers are then bonded such that the dielectric films on both the wafers are in contact with each other. In the high temperature process that follows, the dielectric films reach close to glass transition temperatures and thereby get bonded. The top side of the structure is polished again to form isolated silicon structures surrounded by dielectric film. This method is somewhat complex and the process is not easy to control in manufacturing.

A third method of forming these isolated silicon structures is by forming porous silicon at a desired depth in a silicon wafer, implanted by a dopant, using wet anodization. The porous silicon is then oxidized Alternatively, epitaxial single crystal silicon is deposited over porous silicon which is later oxidized.

U.S. Pat. No. 5,091,330 describes a method of fabricating a dielectric isolated area. The isolated areas are formed by bonding two wafers, each wafer having a first and second surface. Trenches are formed on the first surface of the second wafer. A dielectric layer that can be planarized is then deposited within the trenches on this first surface. The two wafers are then placed together such that the dielectric layer on the second wafer and the first surface of the first wafer are bonded. A portion of the second surface of the second wafer is removed to at least to the bottom of each trench, leaving isolated silicon regions.

U.S. Pat. No. 5,466,631 describes a method for producing a semiconductor article comprising the steps of: preparing the first wafer having a non-porous silicon layer on porous silicon; bonding this wafer to a second wafer such that the non-porous surface is in contact with the second wafer; removing the porous silicon and transferring the non-porous part of silicon from the first wafer to the second wafer, dividing the transferred part of the non-porous silicon into several isolated regions. Porous silicon is formed by anodizing in HF solution and the non-porous silicon is formed by conventional epitaxy, bias sputtering, or molecular beam epitaxy methods.

U.S. Pat. No. 5,773,352 describes a fabrication process of bonded total dielectric isolation substrate. After forming grooves on one surface of a single crystal silicon wafer, a silicon dioxide film is formed followed by a poly-silicon on top of the oxide to fill and cover the grooves. After polishing this layer, another buffer poly-silicon layer is formed over the polished surface. On a second wafer, silicon dioxide layer is formed. Both the wafers are then laminated such that the buffer poly-silicon layer of the first wafer is mated with the oxide layer of the second wafer. After bonding, the composite structure is annealed to complete the bonding. The bonding between poly-silicon and silicon dioxide, according to the inventors, is of superior quality as compared to other bonding surfaces.

U.S. Pat. No. 5,950,094 describes a method for fabricating dielectric isolated silicon by anodizing a buried doped silicon layer through trenches formed between active areas to form porous silicon layer; oxidizing the porous silicon; and depositing a dielectric film in the trenches. An optional boron implant into the sidewalls of the isolated silicon regions to form lightly doped regions act as channel stops. The dielectric layer filling the trenches and the active areas are chemical-mechanically polished to form planar structures.

SUMMARY OF THE INVENTION

Accordingly, it is a primary object of the invention to describe a process to form electrically isolated regions of a semiconductor in a semiconductor substrate.

Another object of the invention is to describe a process to form a plurality of discrete regions of silicon, electrically isolated with silicon dioxide dielectric film.

It is yet another object to form electrically isolated structures of single crystal silicon to form desired device structures therein.

In the present invention, a process is described for forming regions of silicon surrounded by silicon dioxide film that provides electrical isolations between silicon regions, where active devices are formed. Trenches of desired depth are first formed in a silicon wafer using hard mask and conventional lithographic methods. Oxide is grown on the surfaces of trenches, followed by high dose B ion implantation to form a buried heavily doped $B^+$ layer in the silicon wafer. After anisotropic plasma etching to form oxide spacers on the trench walls and expose single crystal silicon at the trench bottom, selective epitaxial silicon is deposited to fill the trenches. After masking the trench areas with photo resist, the wafer is subjected to anodization in a solution of hydrofluoric and nitric acids to form porous silicon in the heavily doped regions, i.e. around and under the trenches. After photo resist stripping, thermal oxidation, and chemical mechanical polishing, dielectric isolated silicon regions or islands are formed.

DETAILED DESCRIPTION OF THE INVENTION

Figure 1:
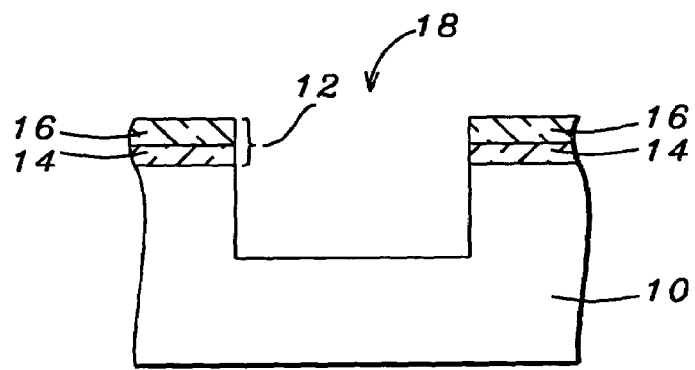
FIG. 1 is a cross-sectional view of a silicon wafer, showing a trench formed using a hard mask.

The invention is described in detail referring to the FIGS. 1–9. In the first step of the process, a hard mask stack 12 comprising of pad oxide 14 and silicon nitride 16 layers is deposited on silicon wafer 10, using deposition methods known in the prior art. Trench pattern is then defined in a resist (not shown in FIG. 1) using methods of lithography known in the prior art. Photo-resist pattern is first tansferred into the hard mask stack using anisotropic plasma etching known in prior art. Trenches 18 are then etched into silicon using a plasma process known in prior art. During trench etching, most of the resist pattern is removed; and any residual mask is removed in a separate ashing process. Since dimensions of the trench define the dimensions of the silicon island, these are tailored to the device that will be later formed in the silicon island. The resulting trench structure is shown in FIG. 1.

Figure 2:
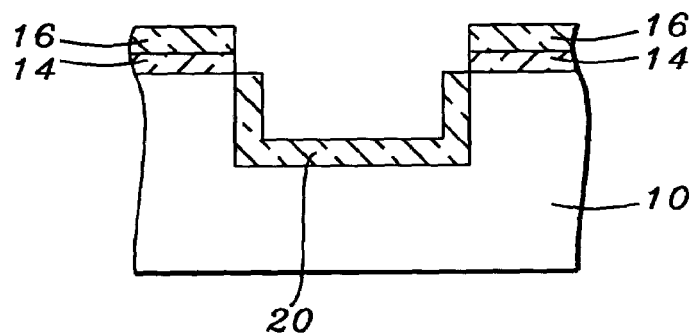
FIG. 2 is a cross-sectional view of a trench, showing a silicon dioxide film grown on the trench surfaces.

Next, a layer of a dielectric film such, as silicon dioxide 20 with a thickness of approximately between 1000 and 2000 A is thermally grown to cover all the inside surfaces of the trench, as shown in FIG. 2. Although the preferred dielectric liner film is silicon dioxide, other suitable films can be substituted such as, silicon nitride, nitrided oxide, and/or oxygen doped silicon nitride.

Figure 3:
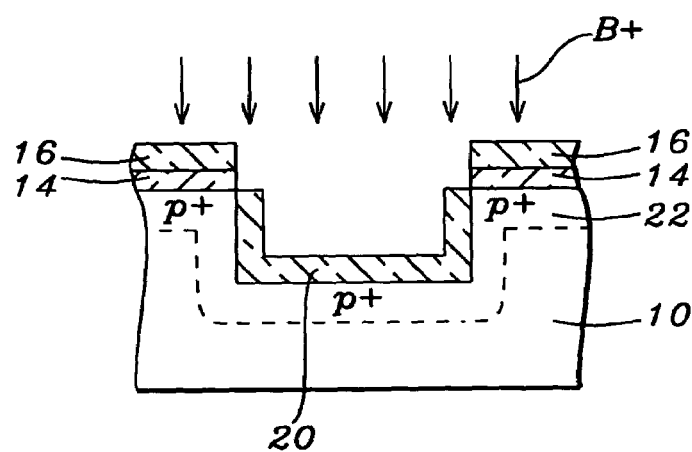
FIG. 3 is a cross-sectional view of a trench, showing heavily implanted $p^+$ regions around the trench.

The wafer is then subjected to high dose $B^+$ ion implantation, known in prior art. The implant conditions are: dose of approximately between $10^{15}$ and $10^{16}$ atom/cm$^2$. Heavily doped $p^+$ regions 22 are thus formed around the trench as shown in FIG. 3. Thickness of this $p^+$ layer is approximately between 4000° A and 6000° A after $B^+$ ion implantation and rapid thermal annealing at approximately between 850° C. and 950° C. to activate $p^+$ regions.

Figure 4:
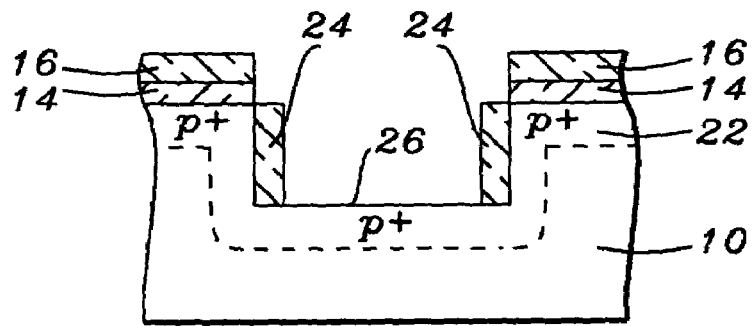
FIG. 4 is a cross-sectional view of a trench, showing sidewall oxide spacers and exposed single crystal trench bottom.

Oxide liner inside the trench is then etched anisotropically using a reactive ion etching process known in prior art, such that only oxide film 24 on trench walls remain, whereas oxide from the trench bottom is completely removed, exposing the silicon 26 at the bottom. The resulting structure is shown in FIG. 4.

Figure 5:
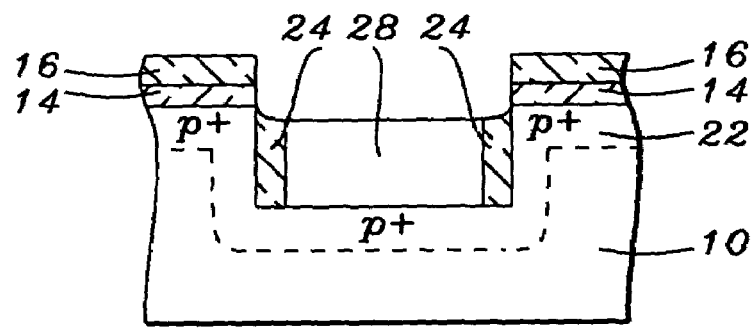
FIG. 5 is a cross-sectional view of a trench, filled with selective epitaxial silicon.

In the next process step, selective epitaxial silicon 28 is formed on the exposed silicon surface 26, using a process known in prior art, such that silicon fully fills the trench as shown in FIG. 5. Because of the nature of selective epitaxy, silicon is formed only on the single crystal silicon surface 26 and not on any other non-silicon surface such as that of hard mask stack. Although in the preferred embodiment, selectively deposited epitaxial silicon is used, non-selective epitaxial silicon can be alternatively used. However, in the case of non-selective deposition, an additional step of chemical mechanical planarization needs to be used to remove the silicon deposited over the hard mask surface and arrive at the structure shown in FIG. 5.

Figure 6:
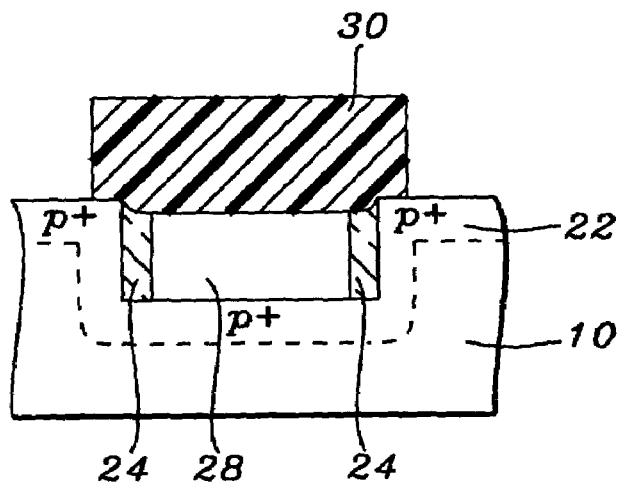
FIG. 6 is a cross-sectional view of a filled trench structure, after removing the hard mask and forming a resist mask pattern over the trench.

Following the epitaxial silicon deposition, the hard mask stack 12 is removed using a dry or a wet process, both known in prior art. The trench area is then masked with a resist pattern 30, formed using lithographic methods known in prior art. The resulting structure is shown in FIG. 6.

Next, the wafer is anodically etched in an aqueous solution of hydrofluoric (HF) and nitric ($HNO_3$)acids, The process conditions are:

Bath composition: 10%–40% HF
Current density: 10–60 mA/cm$^2$
Bath temperature: 20–25° C.

Figure 7:
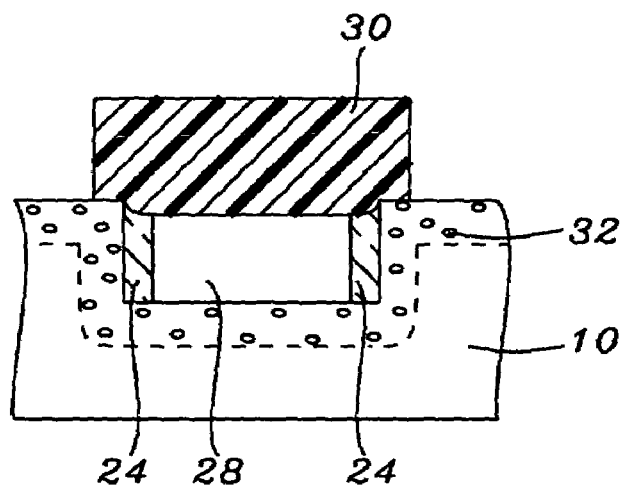
FIG. 7 is a cross-sectional view of a filled trench structure, showing the porous silicon region formed around the trench.

Anodic etching of silicon only attacks the heavily doped regions of silicon thereby forming pores 32 within silicon, as shown by small circles in FIG. 7.

Figure 8:
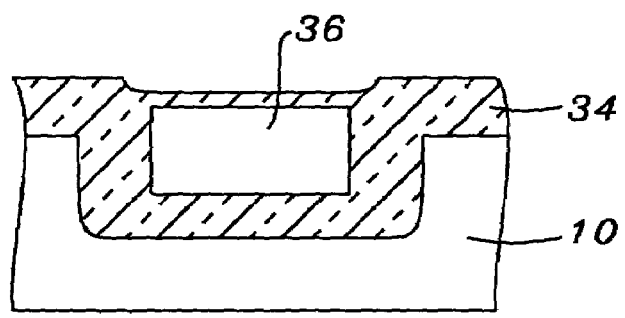
FIG. 8 is a cross-sectional view of a filled trench structure, buried in silicon dioxide.

Photo-resist mask is then stripped and the wafer is oxidized using wet or dry oxidation processes at approximately between 850° C. and 1050° C. known in prior art. The porous silicon rapidly converts fully into silicon dioxide 34, whereas the on the epitaxial silicon surface the oxide formed is quite thin, as shown in FIG. 8. Thickness of this buried silicon dioxide is approximately between 4000° A and 6000° A.

Figure 9:
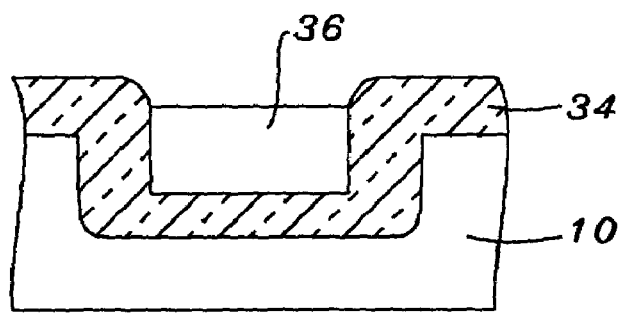
FIG. 9 is a cross-sectional view of a silicon island or region isolated by silicon dioxide surrounding the island.

Finally, the wafer is lightly chemically mechanically polished or planarized using a dry plasma process such that the thin oxide on top of epitaxial silicon surface is completely removed. The silicon island 36 and isolated from other islands by silicon dioxide dielectric 34 is thus formed, as shown in FIG. 9.

While the invention has been particularly shown and described with reference to the general embodiment and a specific application thereof, it will be understood by those skilled in the art that various changes in form and details to the method and applications may be made without departing from the concept, spirit, and the scope of the invention.

The advantages of the process described in this invention over prior art methods are:
a) Epitaxial silicon used and deposited after the trench patterns are formed provides superior quality islands or regions for forming devices.
b) A simpler method to provide dielectric isolation all around epitaxial silicon islands.
c) Formation of porous silicon all around the trenches allows the formation of isolating oxide film around silicon islands in a single oxidations step.
d) A robust dielectric isolation structure prevents latch-up between silicon islands.

What is claimed is:

1. A method of providing an intermediate dielectric isolated silicon structure comprising the steps of:
   forming a trench in a semiconductor substrate;
   forming a dielectric layer on the surfaces of said trench;
   forming a heavily doped buried $p^+$ layer surrounding said trench after said forming a dielectric layer on the surfaces of said trench;
   exposing semiconductor surface on the bottom of said trench;
   depositing a silicon film to fill said trench;
   forming buried porous silicon layer around said filled trench;
   oxidizing said buried porous silicon layer and forming a thin oxide over said deposited silicon surface; and
   forming isolated silicon islands from said deposited silicon.

2. The method of forming dielectric isolated silicon structure according to claim 1, wherein said dielectric layer is a silicon dioxide liner, formed using at least one of thermal oxidation, low pressure chemical vapor deposition (LPCVD), and plasma enhanced CVD.

3. The method of forming dielectric isolated silicon structure according to claim 2, wherein said silicon dioxide liner has a thickness of approximately between 1000 Å and 2000 Å.

4. The method of forming dielectric isolated silicon structure according to claim 1, wherein said heavily doped buried $p^+$ layer is formed by implanting $B^+$ ions with a dose of approximately between $10^{15}$ and $10^{16}$ atom/cm$^2$ into said substrate and through said dielectric layer.

5. The method of forming dielectric isolated silicon structure according to claim 4, wherein said buried $p^+$ layer depth is approximately between 4000 Å and 6000 Å.

6. The method of forming dielectric isolated silicon structure according to claim 1, wherein said silicon film filling the trench is selective epitaxial silicon.

7. The method of forming dielectric isolated silicon structure according to claim 6, wherein, said selective epitaxial film is deposited using methods of at least one of molecular beam epitaxy, low pressure CVD, plasma enhanced CVD, and liquid phase epitaxy.

8. The method of forming dielectric isolated silicon structure according to claim 1, wherein said buried porous silicon layer is formed with anodic etching process comprising:
   etching bath composition: 10%–40% HF
   current density: 10–60 mA/cm$^2$.

9. The method of forming dielectric isolated silicon structure according to claim 1, wherein said buried porous silicon layer is oxidized at approximately between 850 and 1050° C. to form an isolating silicon dioxide layer.

10. The method of forming dielectric isolated silicon structure according to claim 9, wherein said isolating silicon dioxide layer and said dielectric layer have a combined thickness of approximately between 4000 Å and 6000 Å.

11. The method of forming dielectric isolated silicon structure according to claim 1, wherein said forming isolated silicon islands comprises removing said thin oxide to expose said silicon islands using at least one of chemical mechanical polishing, wet, and plasma etching methods.

12. A method of forming intermediate silicon dioxide isolated epitaxial silicon structure comprising the steps of:
   forming a hard mask stack of silicon dioxide and silicon nitride on a single crystal silicon substrate;
   forming a trench pattern in said single crystal silicon substrate;
   forming a silicon dioxide layer on the surfaces of said trench pattern;
   forming a heavily doped buried $p^+$ layer around said trench pattern;
   reactive ion etching said silicon dioxide layer on said trench pattern surfaces to expose single crystal silicon at trench bottom, leaving oxide liner on the walls of said trench pattern;
   depositing selective epitaxial silicon to fill said trench pattern;
   removing said hard mask stack;
   forming a resist pattern to fully mask said filled trench;
   forming buried porous silicon layer around said filled trench;
   oxidizing said buried porous silicon layer and forming a thin oxide over said epitaxial silicon surface; and
   forming epitaxial silicon islands by removing said thin oxide layer from top of said epitaxial silicon surface, usingat least one of chemical mechanical polishing, wet etching methods, and plasma etching methods.

13. The method of forming dielectric isolated silicon structure according to claim 12, wherein said silicon dioxide liner thickness is approximately between 1000 Å and 2000 Å.

14. The method of forming dielectric isolated silicon structure according to claim 12, wherein said heavily doped, buried $p^+$ layer is formed by implanting $B^+$ ions with a dose of approximately between $10^{15}$ and $10^{16}$ atom/cm$^2$.

15. The method of forming dielectric isolated silicon structure according to claim 14, wherein said buried $p^+$ layer depth is approximately between 4000 Å and 6000 Å.

16. The method of forming dielectric isolated silicon structure according to claim 12, wherein said buried porous silicon layer is formed with anodic etching process comprising:
   etching bath composition: 10%–40% HF
   current density: 10–60 mA/cm$^2$.

17. The method of forming dielectric isolated silicon structure according to claim 12, wherein said buried porous silicon layer is oxidized at approximately between 850 and 1050° C.

18. The method of forming dielectric isolated silicon structure according to claim 17, wherein said isolating silicon dioxide layer has a thickness of approximately between 4000 Å and 6000 Å.

* * * * *

UNITED STATES PATENT AND TRADEMARK OFFICE
CERTIFICATE OF CORRECTION

| | | |
|---|---|---|
| PATENT NO. | : 7,067,387 B2 | Page 1 of 1 |
| APPLICATION NO. | : 10/650601 | |
| DATED | : June 27, 2006 | |
| INVENTOR(S) | : Shi-Chi Lin | |

It is certified that error appears in the above-identified patent and that said Letters Patent is hereby corrected as shown below:

Column 6, line 20, replace "usingat" with --using at--.

Signed and Sealed this

Twenty-eighth Day of November, 2006

JON W. DUDAS
*Director of the United States Patent and Trademark Office*